(12) United States Patent
Murayama

(10) Patent No.: US 6,958,298 B2
(45) Date of Patent: Oct. 25, 2005

(54) METHOD FOR THINNING WAFER BY GRINDING

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/851,191

(22) Filed: May 24, 2004

(65) Prior Publication Data
US 2004/0242003 A1 Dec. 2, 2004

(30) Foreign Application Priority Data

May 26, 2003 (JP) ............................. 2003-148113

(51) Int. Cl.⁷ ............................................. H01L 21/31
(52) U.S. Cl. ..................... 438/759; 438/459; 438/690; 438/760
(58) Field of Search ............................. 438/759–760, 438/459, 690

(56) References Cited

U.S. PATENT DOCUMENTS

| 6,338,980 B1 * | 1/2002 | Satoh .......................... 438/106 |
| 6,613,694 B2 * | 9/2003 | Ohuchi et al. ............... 438/759 |
| 2004/0097084 A1 * | 5/2004 | Fukuda et al. .............. 438/690 |

FOREIGN PATENT DOCUMENTS

| EP | 0 981 156 | 2/2000 |
| JP | 55-164623 | 12/1980 |
| JP | 9-115863 | 5/1997 |
| JP | 10-31142 | 2/1998 |
| JP | 11-297719 | 10/1999 |
| JP | 2000-353682 | 12/2000 |
| JP | 2001-93867 | 4/2001 |
| JP | 2001-189292 | 7/2001 |
| JP | 2002-110601 | 4/2002 |
| JP | 2002-264008 | 9/2002 |

* cited by examiner

*Primary Examiner*—Luan Thai
(74) *Attorney, Agent, or Firm*—Staas & Halsey LLP

(57) ABSTRACT

A method for thinning a wafer by placing a wafer having a protective tape attached to the front side thereof, on which chip circuits have been fabricated, on a working table in such a manner that the protective tape is intervened between the wafer and the working table, and grinding the back side of the wafer to thin it, the method comprising, prior to the thinning by grinding, adhering the beveled portion at the front side of the wafer to the protective tape. The adhesion is preferably effected by a material exhibiting a modulus of elasticity of 0.1 to 100 MPa at the state of the adhesion of the beveled portion to the protective tape. As the material for the adhesion, an acrylic resinous material of the UV-curing type can be used.

5 Claims, 1 Drawing Sheet

METHOD FOR THINNING WAFER BY GRINDING

BACKGROUND OF THE INVENTION

1. Field of the Invention

The invention relates to a method for thinning a wafer. More particularly, the invention relates to a method for thinning a wafer, which has had certain chip circuits fabricated therein through processes such as patterning, into a final product thickness, before the wafer is diced into chips.

2. Description of the Related Art

For the thinning of a wafer, after the fabrication of chip circuits is finished, a back side grinder is usually used. The back side grinder is a grinding wheel made of abrasive grain, such as of diamond. A wafer is machined to have a predetermined thickness by the rotation of the grinding wheel (which is called back side grinding).

Back side grinding of a wafer is conventionally carried out as follows. As shown in FIG. 2, a wafer 104 having a protective tape 106 of a pressure sensitive type attached to a side (front side), on which chip circuits have been fabricated, is placed on a wafer table 102 having a porous sucking section 102b inside a frame 102a, in such a manner that it is sucked by the sucking section 102b through the protective tape 106. The wafer has a peripheral area having a thickness which is generally smaller than that of the other portion due to edge treatment. The peripheral area does not adhere to the protective tape 106, as shown in the drawing.

A rotational grinding wheel 108 is applied to the back side of the wafer 104 (the upper side when the wafer is sucked to the wafer table 102 with the chip circuits-formed face down, as shown in FIG. 2), for rough grinding. For 6-inch (about 15 centimeters) and 8-inch (about 20 centimeters) silicon wafers, rough grinding conditions are: 3 $\mu$m/sec wheel feed rate, 2400 rpm wheel rotational speed, and 200 rpm table rotational speed, for example. Subsequently, finish grinding is carried out at the conditions of, for example, 1 $\mu$m/sec wheel feed rate, 2400 rpm wheel rotational speed, and 200 rpm table rotational speed, which is additionally followed by polishing. Polishing conditions are: 150 g/cm$^2$ (14.7 kPa) pressure, 280 rpm buffing wheel rotational sped, and 240 rpm table rotational speed, for example. The wafer 104 is then removed from the wafer table, and the protective tape 106 is peeled off.

In such a thinning process, a wafer to be thinned having a smaller thickness is warped at its periphery and becomes easily cracked during the grinding, although these problems are not occur when the wafer has a greater thickness since the wafer itself is tough. The problems cause a reduction in productivity of final products, and are not preferred.

JP 2001-93867 A describes a method for grinding a wafer and a protective member at the outer periphery of the wafer, as a relevant technique, and discloses a method for grinding a wafer using a protective member, which is removably fitted to the outer periphery of the wafer for the protection of the outer periphery. The protective member has a protective layer and an adhesive layer, and is adhered to the outer periphery (the outer circumference and its proximity) of the wafer and is peelable in the diametral direction.

JP 2001-189292 A describes, as a method for preventing the thickness of the outer periphery of a wafer after grinding from becoming small ("edge rounding"), a method in which an adhesive is applied to a wafer to be attached to a holding table in such a manner that the applied adhesive has a thickness at the outer periphery of the wafer which is smaller than the thickness at the inside.

JP 2002-110601 A also describes a method for preventing edge rounding in a wafer after grinding, in which method a wax is applied to a wafer in such a manner that the applied wax has a thickness at the outer periphery which is smaller than the thickness at the inside.

JP 2002-264008 also describes a technique for preventing the edge rounding in a wafer after grinding, according to which the edge rounding in a wafer is prevented by allowing the outer periphery of the wafer to be warped and deformed depending on the magnitude of a grinding pressure when the outer periphery of the wafer is applied with a grinding pressure no smaller than that applied to the inside thereof during the grinding.

SUMMARY OF THE INVENTION

An object of the invention to provide a method for thinning a wafer, which can prevent warping of the periphery of a wafer during a thinning process even if the wafer to be thinned has a small thickness, to thereby prevent the generation of cracks at the periphery of the wafer.

The method for thinning a wafer of the invention is a method for thinning a wafer by placing a wafer having a protective tape attached to the front side thereof, on which chip circuits have been fabricated, on a working table and in such a manner that the protective tape is intervened between the wafer and the working table, and grinding the back side of the wafer to thin it, the method being characterized by comprising, prior to the thinning by grinding, adhering the beveled portion (edge portion) at the front side of the wafer to the protective tape.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Figure 1A:
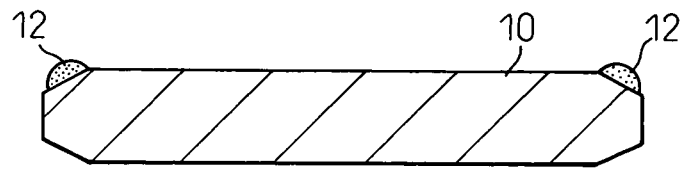
FIGS. 1A to 1C illustrate the thinning of a silicon wafer according to the invention.

In the method for thinning a wafer of the invention, the beveled portion at the front side of a wafer, on which chip circuits have been formed, is adhered to a protective tape which is attached to the front side, prior to the thinning of the wafer by grinding. From this, the warping of the periphery of the wafer during the grinding by a rotational grinding wheel can be prevented, and cracks at that portion of the wafer can be prevented, even when the wafer to be worked is thin.

The adhesion of the protective tape to the beveled portion of the wafer can be effected using an adhesive material. As the adhesive material, although any material is usable, it is favorable to use a material exhibiting a modulus of elasticity of the order of 0.1 to 100 MPa, preferably about 10 MPa, at the state of the adhesion of the beveled portion to the protective tape. With a modulus of elasticity of smaller than 0.1 MPa, the wafer becomes mobile during the thinning, causing the wafer to be damaged. A modulus of elasticity of larger than 100 MPa is not preferred, in that stress during the thinning cannot be absorbed, causing the wafer to crack.

Examples of adhesive materials preferably used in the method of the invention include acrylic resinous materials of UV-curing type. Although acrylic adhesive materials of the thermosetting type are also usable, the UV-curing type materials are more readily cured.

The adhesive material may be applied to either the beveled portion of the wafer or the corresponding portion of the protective tape. However, the adhesive material is generally and preferably applied to the beveled portion of the wafer, because the protective tape can change in size in some cases, providing a possibility of the displacement of the adhesive materials relative to the beveled portion of the wafer.

The application of the adhesive material can be effected by any usable method. For example, when an organic adhesive material, such as an acrylic material, is used, ink jet printing, an application process using a dispenser, or the like can be used.

The protective tape is peeled off after the termination of grinding and polishing of a wafer. The adhesive material may be removed from the wafer together with the protective tape or part or substantially all thereof may be left at the wafer side.

Although a representative of the wafers that can be thinned by a method of the invention is a silicon wafer, the method is also applicable to the thinning of a wafer of a semiconductor other than silicon.

The method for thinning a wafer of the invention can be implemented in a similar manner to a conventional method, except for the adhesion of the beveled portion at the front side of a wafer to the protective tape, and it is not necessary to describe such a conventional method in detail here. To more specifically exemplify the invention, the following example is provided.

EXAMPLE

An example of thinning a 6-inch (about 15 centimeters, 625 micrometers thick) or 8-inch (about 20 centimeters, 750 micrometers thick) silicon wafer is described here.

Figure 1B:
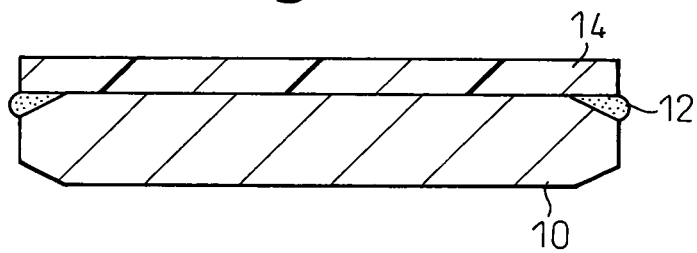

As shown in FIG. 1A, an acrylic adhesive resinous material 12 of UV-curing type, which has a modulus of elasticity after curing of about 10 MPa, is applied to the entire periphery of beveled portion of the side of a silicon wafer 10, on which chip circuits is formed, by ink jet printing, so as to have a width and a height of the order of 40 and 20 micrometers, respectively. Subsequently, as shown in FIG. 1B, a protective tape 14 of pressure sensitivity type is attached to the chip circuit-formed side of the wafer 10, during which the resinous material 12 at the beveled portion is spread to be leveled. The resinous material 12 is cured by irradiation with UV light having a main wavelength of 365 nanometers at a dose of 1200 mJ/cm$^2$.

Figure 1C:
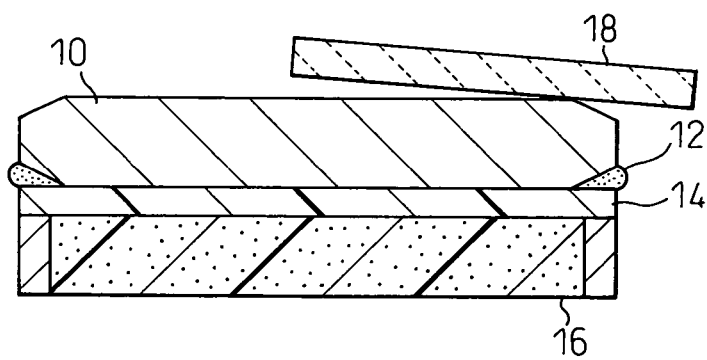
Figure 2:
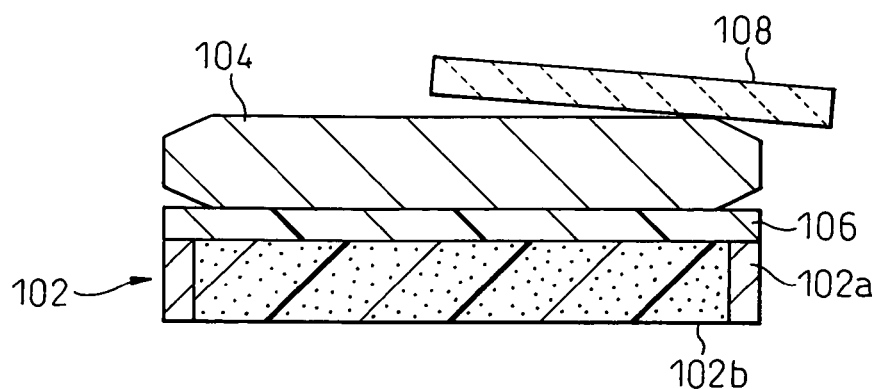
FIG. 2 is an illustration of conventional thinning of a silicon wafer.

As shown in FIG. 1C, the wafer 10, with the side having the protective tape 14 attached down, is then place on a wafer table 16, and the back side of the wafer 10 is roughly ground by a grinding wheel 18, at the conditions of 3 μm/sec wheel feed rate, 2400 rpm wheel rotational speed, and 200 rpm table rotational speed. Subsequently, finish grinding is carried out at the conditions of 0.5 μm/sec wheel feed rate, 2400 rpm wheel rotational speed, and 200 rpm table rotational speed. After the completion of grinding, the wafer is polished at the conditions of 150 g/cm$^2$ (14.7 kPa) pressure, 280 rpm buffing wheel rotational sped, and 240 rpm table rotational speed. The wafer 10 is then removed from the table 16, and the protective tape 14 is peeled off, to obtain a thinned silicon wafer of 10 micrometers thick free of peripheral cracks.

As described, the invention makes it possible to thin even a wafer having a small thickness without developing peripheral cracks, and can contribute to the improvement in productivity of chips manufactured from a wafer.

What is claimed is:

1. A method for thinning a wafer by placing a wafer having a protective tape attached to the front side thereof, on which chip circuits have been fabricated, on a working table, in such a manner that the protective tape is intervened between the wafer and the working table, and grinding the back side of the wafer to thin it, the method comprising, prior to the thinning by grinding, adhering the beveled portion at the front side of the wafer to the protective tape.

2. The method for thinning a wafer of claim 1, wherein the adhesion is effected by a material exhibiting a modulus of elasticity of 0.1 to 100 MPa at the state of the adhesion of the beveled portion to the protective tape.

3. The method for thinning a wafer of claim 1, wherein, as a material for the adhesion, an acrylic resinous material of the UV-curing type is used.

4. The method for thinning a wafer of claim 1, wherein a material for the adhesion is applied to the beveled portion of the wafer, and is then adhered to the protective tape.

5. The method for thinning a wafer of claim 4, wherein the application of the material for the adhesion is effected using ink jet printing or a dispenser.

* * * * *